(12) United States Patent
Nair et al.

(10) Patent No.: US 6,319,114 B1
(45) Date of Patent: Nov. 20, 2001

(54) THERMAL MANAGEMENT SYSTEM

(75) Inventors: Rajesh Nair, Nashua, NH (US); Roger Holman, Acton, MA (US); David Gagnon, Brookline, NH (US)

(73) Assignee: Degree Controls, Inc., Milford, NH (US)

( * ) Notice: Subject to any disclaimer, the term of this patent is extended or adjusted under 35 U.S.C. 154(b) by 0 days.

(21) Appl. No.: 09/438,733

(22) Filed: Nov. 11, 1999

(51) Int. Cl.$^7$ .............................. H05K 5/00; B01D 46/46
(52) U.S. Cl. ................. 454/184; 95/14; 96/420; 165/803; 236/49.3
(58) Field of Search .................. 95/14; 96/420; 236/49.3; 165/80.3; 454/184; 417/42; 62/259.2

(56) References Cited

U.S. PATENT DOCUMENTS 5,467,607 * 11/1995 Harvey .................................. 62/159
5,769,705 * 6/1998 O'Callaghan et al. .

FOREIGN PATENT DOCUMENTS

402157495 * 6/1990 (JP) ........................................ 417/42

* cited by examiner

Primary Examiner—William Wayner
(74) Attorney, Agent, or Firm—Iandiorio & Teska

(57) ABSTRACT

A thermal management system for an enclosure housing devices which generate heat inside the enclosure. A fan, whose speed is responsive to an input signal, has a gas flow output in communication with the enclosure. A filter is disposed in the gas flow path of the fan's output. At least one temperature sensor is disposed in the enclosure for measuring the temperature inside the enclosure. A controller adjusts the speed of the fan until the temperature inside the enclosure is within a predetermined range to ensure that the devices inside the enclosure do not overheat. A processor compares the signal input to the fan with the speed of the fan to determine the condition of the fan and, in response to the temperature sensor, determines the condition of the filter.

15 Claims, 2 Drawing Sheets

THERMAL MANAGEMENT SYSTEM

FIELD OF INVENTION

This invention relates to a thermal management system including a fan disposed to force air through a filter over heat generating components such as electronic circuit cards and a control subsystem which monitors the temperature of the air inside the cabinet and/or the air flow rate through the cabinet and which also simultaneously monitors the condition of the fan and/or the filter and which provides an indication when the fan is not working properly and/or when the filter is clogged.

BACKGROUND OF INVENTION

Thermal management systems generally include an enclosure such as a housing or cabinet for heat generating electronic component circuit cards or boards which must be cooled to prevent damage to the electronic components. A variable speed fan is disposed to force air over the components and a temperature sensor and/or an air flow sensor monitors the temperature and/or air flow rate of the air or other cooling gas inside the cabinet.

A filter is used to reduce particulate matter in order to eliminate contaminants which could otherwise foul the circuit cards. A controller, connected to the fan and responsive to the temperature sensor and/or the air flow sensor, continuously monitors the temperature of the electronic circuit cards and adjusts the speed of the fan to keep the electronic components cool.

Such prior art systems, however, do not include means to determine the fan's condition or health. When the fan's bearings or motor begins to fail, the fan, operating at even full capacity, may not properly cool the electronic components and by the time this condition is detected manually, certain electronic components may have already failed, become thermally stressed, or degraded to the point where failure is imminent.

Prior art systems also fail to include any means for determining whether the filter is clogged to the point where cooling is no longer effective. Again, when the filter is clogged, the air flow rate through the cabinet may be less than optimal even at the highest fan speed resulting in component failure, thermal stress, or degradation which may not be detectable.

BRIEF SUMMARY OF THE INVENTION

It is therefore an object of this invention to provide a more complete thermal management system for enclosures or cabinets housing electronic components.

It is a further object of this invention to provide such a thermal management system which automatically monitors the condition of the fan or its components and which provides an output signal when the fan is incapable of providing sufficient air flow to keep the electronic components cool.

It is a further object of this invention to provide such a thermal management system which automatically detects when the filter is clogged and when the air flow rate through the cabinet is less than optimal.

It is a further object of this invention to provide such a thermal management system which is simple in design, easy to implement, and which can be added to existing thermal management systems at little cost to the customer.

This invention results from the realization that since the controller of most thermal management systems automatically adjusts the speed of the fan until the air temperature inside the enclosure is optimal, the controller can be modified to also automatically determine the condition of the fan by comparing the input (e.g., voltage) signal to the fan with the speed of the fan since, in poorly operating fans, fan speed will be normally lower for a given input signal; and from the further realization that the controller can be modified to also automatically determine the condition of the air filter in the enclosure for dirty or clogged conditions by comparing, for example, the enclosure air flow rate with the speed of the fan since a clogged filter results in a lower air flow rate at a given fan speed.

The controller monitors the fan's speed, the voltage level applied to the fan, and the temperature(s) inside the enclosure and provides some kind of a notification when these signals indicate a poorly working fan and/or a clogged filter, in addition to functioning to speed up the fan to provide more air flow as needed to keep heat generating devices such as circuit boards cool to prevent component failures.

This invention features a thermal management system comprising an enclosure housing devices which generate heat; a fan whose speed is responsive to an input signal, the fan having a gas flow output in communication with the enclosure; a filter disposed in the gas flow path of the fan's output; at least one temperature sensor disposed in the enclosure for measuring the temperature inside the enclosure; a controller for adjusting the speed of the fan until the temperature inside the enclosure is within a predetermined range to ensure that the devices inside the enclosure do not overheat; means for comparing the signal input to the fan with the speed of the fan to determine the condition of the fan; and means, responsive to the temperature sensor, for determining the condition of the filter.

If the input signal to the fan is a voltage signal, the means for comparing includes a processor programmed to compare the voltage signal with the speed of the fan and to provide an output signal indicative of a poorly operating fan when the voltage signal exceeds a predetermined threshold for a predetermined fan speed.

There are several embodiments of the means for determining the condition of the filter. In one embodiment a processor is programmed to compare the temperature inside the enclosure with the speed of the fan and to provide an output signal indicative of a clogged filter when the temperature inside the enclosure exceeds a predetermined threshold for a predetermined fan speed. In another embodiment, the means for determining the condition of the filter includes a second temperature sensor disposed to measure the temperature of a gas flow entering the enclosure and a processor, responsive to the second temperature sensor, programmed to compare the temperature of the gas flow entering the enclosure with the temperature inside the enclosure and to provide an output signal indicative of a clogged filter when the difference between the two temperatures exceeds a predetermined threshold at a predetermined fan speed. In still another embodiment, the means for determining the condition of the filter includes at least one gas flow rate sensor disposed to measure the gas flow rate through the enclosure and a processor programmed to provide an output signal indicative of a clogged filter when the gas flow rate is less than a predetermined level at a predetermined fan speed.

Typically, the enclosure and even the fan and filter are not necessarily components of the thermal management system of this invention which includes at least one temperature sensor disposed in the enclosure for measuring the temperature inside the enclosure; a controller for adjusting the speed of the fan until the temperature inside the enclosure is within a predetermined range to ensure that the devices inside the enclosure do not overheat; means for determining the condition of the fan; and means, responsive to the temperature sensor, for determining the condition of the filter.

In most embodiments, the thermal management system comprises a temperature sensor for measuring the temperature inside an enclosure to be cooled with a fan whose speed depends on a fan input signal; and a controller responsive to the temperature sensor and connectable to the fan for monitoring the temperature inside the enclosure and adjusting the speed of the fan until the temperature inside the enclosure is within a predetermined range, the controller including: means for comparing the fan input signal with the speed of the fan to determine the condition of the fan; and means, responsive to the temperature sensor, for determining the condition of the filter. A thermal management system for detecting a poorly operating fan in accordance with this invention includes a temperature sensor for measuring the temperature inside an enclosure to be cooled with a fan whose speed depends on a fan input signal; and a controller responsive to the temperature sensor and connectable to the fan for monitoring the temperature inside the enclosure and adjusting the speed of the fan until the temperature inside the enclosure is within a predetermined range, the controller including means for comparing the fan input signal with the speed of the fan to determine the condition of the fan.

A thermal management system for detecting whether the filter is clogged in accordance with this invention includes a temperature sensor for measuring the temperature inside an enclosure to be cooled with a fan whose speed depends on a fan input signal; and a controller responsive to the temperature sensor and connectable to the fan for monitoring the temperature inside the enclosure and adjusting the speed of the fan until the temperature inside the enclosure is within a predetermined range, the controller including means, responsive to the temperature sensor, for determining the condition of the filter.

In one embodiment, the means for determining the condition of the filter includes a processor programmned to compare the temperature inside the enclosure with the speed of the fan and to provide an output signal indicative of a clogged filter when the temperature inside the enclosure exceeds a predetermined threshold for a predetermined fan speed. In another embodiment, the means for determining the condition of the filter includes a second temperature sensor disposed to measure the temperature of a gas flow entering the enclosure and a processor, responsive to the second temperature sensor, programmed to compare the temperature of the gas flow entering the enclosure with the temperature inside the enclosure and to provide an output signal indicative of a clogged filter when the difference between the two temperatures exceeds a predetermined amount at a predetermined fan speed. In still another embodiment, the means for determining the condition of the filter includes a gas flow rate sensor disposed to measure the gas flow rate through the enclosure and a processor programmed to provide an output signal indicative of a clogged filter when the gas flow rate is less than a predetermined level at a predetermined fan speed.

BRIEF DESCRIPTION OF THE DRAWINGS

Other objects, features and advantages will occur to those skilled in the art from the following description of a preferred embodiment and the accompanying drawings, in which.

DETAILED DESCRIPTION

Figure 1:
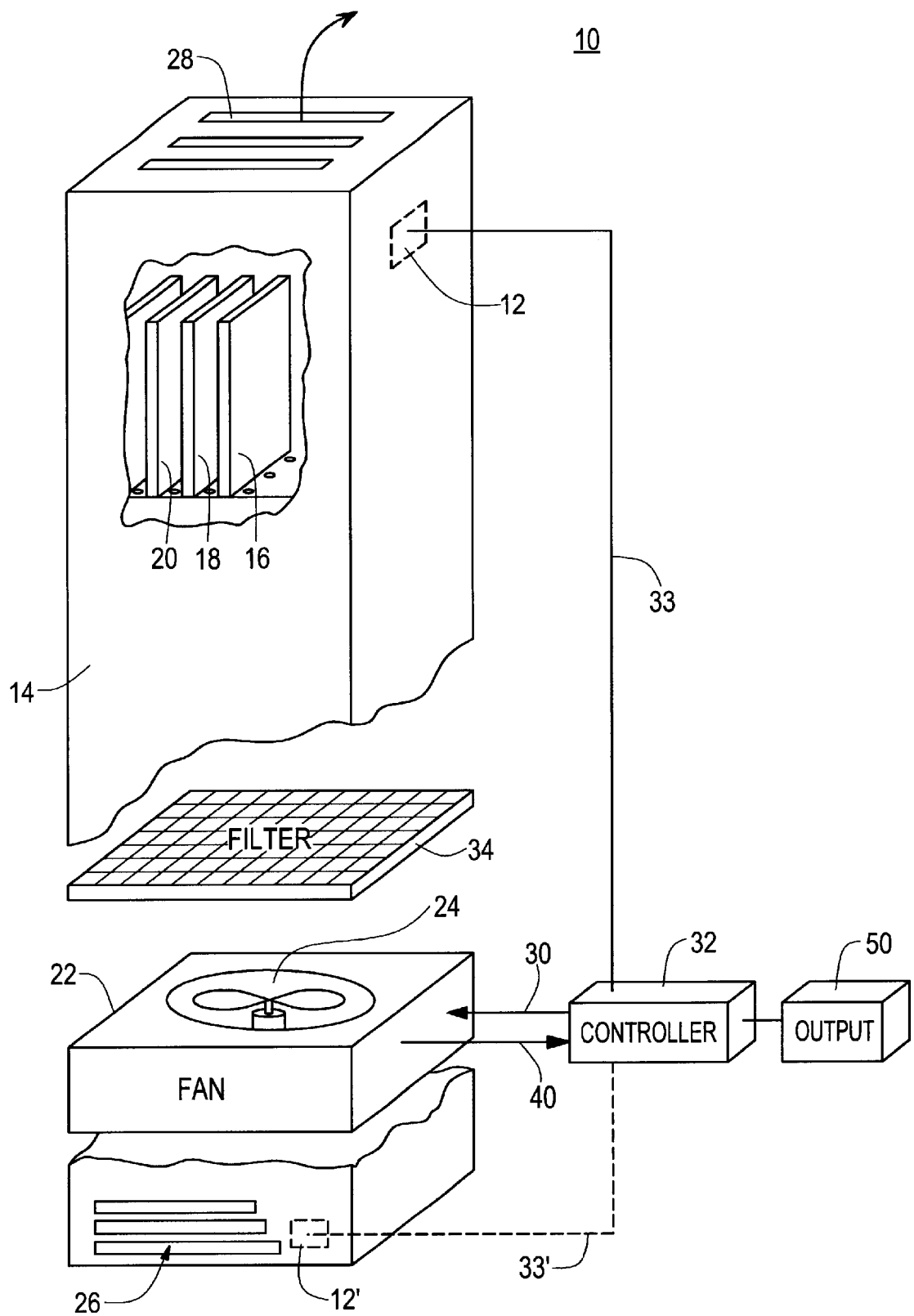
FIG. 1 is a schematic view of the thermal management system of the subject invention.
Figure 2:
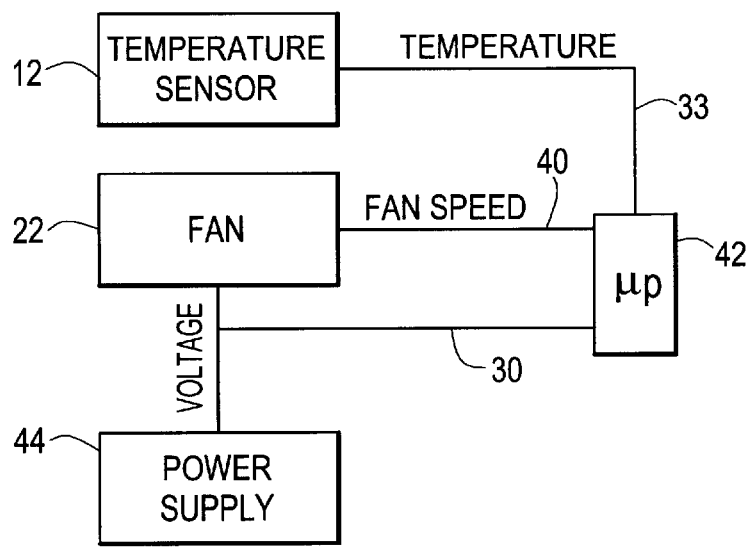
FIG. 2 is a block diagram showing the basic inputs and outputs of each major component of the thermal management system of the subject invention.

Thermal management system 10, FIGS. 1 and 2 includes temperature sensor and/or air flow sensor 12 mounted inside enclosure or cabinet 14 which houses devices which generate heat such as circuit cards 16, 18, and 20. Sensor 12 as represented in the drawings may be disposed to monitor the air temperature and/or the flow rate inside the enclosure 14 proximate devices 16, 18, and 20, may be disposed to monitor the temperature of the components on the circuit cards, and/or may be disposed to monitor the air temperature and/or the flow rate of the gas as it exits cabinet 14 via louvers 28. Thus, sensor 12 may be a number of thermocouples, flow rate sensors, or combinations thereof. Fan 22 is usually disposed proximate the bottom of cabinet 14 and has an output 24 which forces air over circuit cards 16, 18, and 20 from intake 26 to outtake 28. Fan 22 has a variable speed in response to a signal (e.g., voltage) provided on line 30 by controller 32. Filter 34 is disposed proximate fan 22 and in the path of the output of fan 22 to prevent particulate matter from contaminating electronic circuit cards 16, 18, and 20.

Controller 32 is programmed to periodically poll temperature and/or air flow sensor 12 and in some embodiments optional temperature and/or air flow sensor 12' via lines 33 and 33' respectively and to adjust the speed of fan 22 via power supply 44, FIG. 2 until the temperature inside cabinet 14, FIG. 1 is within a predetermined range to ensure that the electronic components on circuit cards 16, 18, and 20 do not overheat and fail, become thermally stressed, or degrade.

The subject invention takes advantage of the fact that controller 32, FIG. 1 communicates with fan 22 and temperature/flow rate sensing devices 12 and 12' to control the temperature inside cabinet 14. Controller 32 keeps track of the fan speed, the voltage level applied to the fan, and the temperatures inside the enclosure and provides for some kind of notification when these signals indicate a poorly working fan and/or a clogged filter in addition to functioning to speed up the fan to provide more air flow as needed to keep the heat generating devices such as circuit cards 16, 18, and 20 cool to prevent failure of their electronic components.

Figure 3:
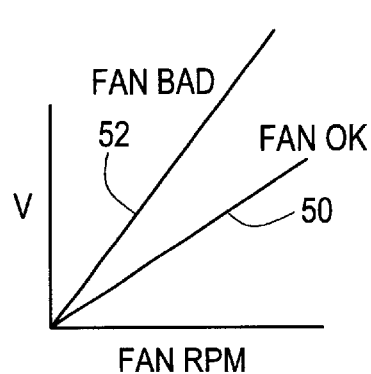
FIG. 3 is a graph showing how the voltage drawn by the fan varies with respect to the fan speed for a properly working fan and a fan with failing or failed components.

To this end, included as a part of system 10 are means for comparing the signal on line 30 input to fan 22 with the speed of the fan via a signal on line 40 to determine the condition of the fan. As shown in FIG. 3, the fan's speed is a function of the voltage or other input signal to fan 22, FIGS. 1–2. When the fan is properly working, the relationship between the fan speed and the voltage input is known and shown as curve 50, FIG. 3. As the fan's bearings and other components wear or degrade, however, the fan speed for a given voltage value departs from curve 50 as shown by curve 52.

Thus, in accordance with this invention, microprocessor 42, FIG. 2, which may be a component of controller 32, FIG. 1, is programmed to compare the voltage on line 30 with the speed of the fan via a signal output on line 40 and to provide a signal output to, for example, a light emitting diode or other output device 50, FIG. 1 when the voltage signal exceeds a predetermined threshold for a predetermined fan speed to thus provide an indication that the fan is not properly working.

Figure 4:
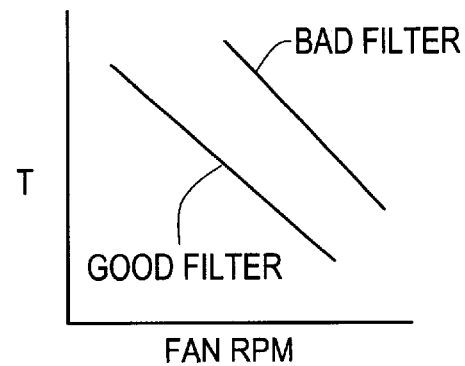
FIG. 4 is a graph showing the relationship between the temperature inside an electronic housing compared to the fan speed for a clean filter and a bad or clogged filter.

In a similar fashion, system 10, FIG. 1 includes means for determining the condition of filter 34. As shown in FIG. 4, the temperature sensed by sensor 12, FIGS. 1–2 varies with fan speed but is also dependent on the condition of the filter. So, at one fan speed, if the filter is not clogged, the cabinet temperature may be optimal. When, however, the filter is clogged, the same fan speed will result in a cabinet temperature which is higher than optimal. Another way to determine when the filter is clogged is by monitoring the temperature of the air at intake 26, FIG. 1 as compared to the temperature of the air at outtake 28. For a given fan speed or range of speeds, the output temperature will be higher when the filter is clogged since the air flow in cabinet 14 will be reduced due to the increased resistance to air flow caused by the clogged filter.

Accordingly, there are four ways to determine the condition of filter 34, FIG. 1. In the first embodiment, the means for determining the condition of the filter includes processor 42, FIG. 2 programmed to compare the temperature signal on line 33 representative of the temperature inside the enclosure with the speed of the fan signal on line 40 and to provide an output signal indicative of a clogged filter when the temperature inside the enclosure exceeds a predetermined threshold for a predetermined fan speed as shown in FIG. 4.

Figure 5:
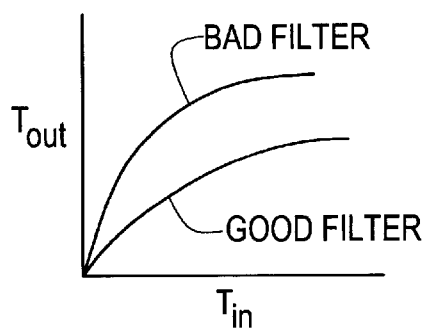
FIG. 5 is a graph showing the relationship between the inlet temperature and the outlet temperature of an electronic cabinet for a clean filter and a clogged filter.

In the second embodiment, the means for determining the condition of filter 34 includes second temperature sensor and/or air flow rate measurement device 12', FIG. 1 which measures the temperature and/or air flow rate of the air entering enclosure 14. In this embodiment, processor 42, FIG. 2 is responsive to this second temperature and/or air flow rate sensor and programmed to compare the temperature of the air flow entering enclosure 14 through intake 26, FIG. 1 with the temperature and/or flow rate of the air inside or exiting the enclosure represented as a signal on line 33, FIG. 2 and also to provide an output signal indicative of a clogged filter when the difference between the two temperatures or air flow rates exceeds a predetermined threshold at a predetermined fan speed as shown in FIG. 5.

Figure 6:
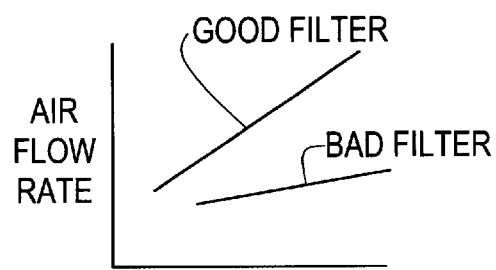
FIG. 6. is a graph of fan speed and the air flow of an electronic cabinet for a clean filter and a clogged filter.

In the third embodiment, the means for determining the condition of the filter 34 includes air flow rate measuring device 12, FIG. 1 and processor 42, FIG. 2 which is programmed to provide an output signal indicative of a clogged filter when the air flow rate is less than a predetermined level at a given fan speed as shown in FIG. 6. Again, the added resistance to a proper level of air flow through cabinet 14 because of a clogged filter 34 results in a lower air flow rate for a given fan speed which can be detected by processor 42 provided measuring device 12, FIG. 1 includes an air flow rate sensor.

In some embodiments, controller 32 includes both means for determining the condition of fan 22, FIG. 1 and means for determining the condition of filter 34. In other embodiments, only one of these means is present. In some presently available fans, there is an integrated output port for which provides a signal indicative of the fan speed. In other fans, some kind of a fan speed indicator will have to be coupled to the fan. Also, some presently available fans are speed adjustable by the voltage applied to the fan. Others receive as input an analog or digital signal which correlates to a given fan speed.

In the preferred embodiment, controller 32, FIG. 1 and output device 50 are sold as a single unit with fan 22 according to the customer's specifications for electronic cabinet 14. The customer then receives, in addition to a system which provides sufficient cooling of electronic components 16–20, FIG. 1, a subsystem which automatically provides the customer with an indication of the fan's and the filter's operating conditions without the need for the customer to open cabinet 14 and undertake a physical inspection of filter 34 for cleanliness and electrical testing of fan 22 for wear.

Although specific features of the invention are shown in some drawings and not in others, this is for convenience only as each feature may be combined with any or all of the other features in accordance with the invention.

Other embodiments will occur to those skilled in the art and are within the following claims.

What is claimed is:

1. A thermal management system comprising:

an enclosure housing devices which generate heat;

a fan, whose speed is responsive to an input signal, the fan having a gas flow output in communication with the enclosure;

a filter disposed in the gas flow path of the fan's output;

at least one temperature sensor disposed in the enclosure for measuring the temperature inside the enclosure;

a controller for adjusting the speed of the fan until the temperature inside the enclosure is within a predetermined range to ensure that the devices inside the enclosure do not overheat;

means for comparing the input signal to the fan with the speed of the fan to determine the condition of the fan; and means, responsive to the temperature sensor, for determining the condition of the filter.

2. The system of claim 1 in which the input signal to the fan is a voltage signal and the means for comparing includes a processor programmed to compare the voltage signal with the speed of the fan and to provide an output signal indicative of a poorly operating fan when the voltage signal exceeds a predetermined threshold for a predetermined fan speed.

3. The system of claim 1 in which the means for determining the condition of the filter includes a processor programmed to compare the temperature inside the enclosure with the speed of the fan and to provide an output signal indicative of a clogged filter when the temperature inside the enclosure exceeds a predetermined threshold for a predetermined fan speed.

4. The system of claim 1 in which the means for determining the condition of the filter includes a second temperature sensor disposed to measure the temperature of a gas flow entering the enclosure and a processor, responsive to the second temperature sensor, programmed to compare the temperature of the gas flow entering the enclosure with the temperature inside the enclosure and to provide an output signal indicative of a clogged filter when the difference between the two temperatures exceeds a predetermined threshold at a predetermined fan speed.

5. A thermal management system for an enclosure housing devices which generate heat cooled by a variable speed fan providing a gas flow outlet filtered by a filter, the system comprising:

at least one temperature sensor disposed in the enclosure for measuring the temperature inside the enclosure;

a controller for adjusting the speed of the fan until the temperature inside the enclosure is within a predetermined range to ensure that the devices inside the enclosure do not overheat;

means for determining the condition of the fan; and means, responsive to the temperature sensor, for determining the condition of the filter.

6. A thermal management system comprising:

an enclosure housing devices which generate heat;

a fan whose speed is responsive to an input signal, the fan having a gas flow output in communication with the enclosure;

a filter disposed in the gas flow path of the fan's output;

at least one temperature sensor disposed in the enclosure for measuring the temperature inside the enclosure;

a controller for adjusting the speed of the fan until the temperature inside the enclosure is within a predetermined range to ensure that devices inside the enclosure do not overheat;

at least one gas flow rate sensor disposed to measure the flow rate through the enclosure; and a processor, responsive to the at least one gas flow rate sensor, programmed to provide an output signal indicative of a clogged filter when the gas flow rate is less than a predetermined level at a predetermined fan speed.

7. A thermal management system comprising:

a temperature sensor for measuring the temperature inside an enclosure to be cooled with a gas flow through a filter from a fan, whose speed depends on a fan input signal; and a controller responsive to the temperature sensor and connectable to the fan for monitoring the temperature inside the enclosure and adjusting the speed of the fan until the temperature inside the enclosure is within a predetermined range, the controller including:

means for comparing the fan input signal with the speed of the fan to determine the condition of the fan; and means, responsive to the temperature sensor, for determining the condition of the filter.

8. The system of claim 7 in which the fan input signal is a voltage signal and the means for comparing includes a processor programmed to compare the voltage signal with the speed of the fan and to provide an output signal indicative of a poorly operating fan when the voltage signal exceeds a predetermined threshold for a predetermined fan speed.

9. The system of claim 7 in which the means for determining the condition of the filter includes a processor programmed to compare the temperature inside the enclosure with the speed of the fan and to provide an output signal indicative of a clogged filter when the temperature inside the enclosure exceeds a predetermined threshold for a predetermined fan speed.

10. The system of claim 7 in which the means for determining the condition of the filter includes a second temperature sensor disposed to measure the temperature of a gas flow entering the enclosure and a processor, responsive to the second temperature sensor, programmed to compare the temperature of the gas flow entering the enclosure with the temperature of the inside of the disclosure and to provide an output signal indicative of a clogged filter when the difference between the two temperatures exceeds a predetermined amount at a predetermined fan speed.

11. A thermal management system comprising:

a temperature sensor for measuring the temperature inside an enclosure to be cooled with a gas flow through filter from fan, whose speed depends on a fan input signal; and a controller responsive to the temperature sensor and connectable to the fan for monitoring the temperature inside the enclosure and adjusting the speed of the fan until the temperature inside the enclosure is within a predetermined range, the controller including means, responsive to the temperature sensor, for determining the condition of the filter.

12. The system of claim 11 further including means for comparing the fan input signal with the speed of the fan to determine the condition of the fan.

13. The system of claim 11 in which the fan input signal is a voltage signal and the means for comparing includes a processor programmed to compare the voltage signal with the speed of the fan and to provide an output signal indicative of a poorly operating fan when the voltage signal exceeds a predetermined threshold for a predetermined fan speed.

14. The system of claim 11 in which the means for determining the condition of the filter includes a processor programmed to compare the temperature inside the enclosure with the speed of the fan and to provide an output signal indicative of a clogged filter when the temperature inside the enclosure exceeds a predetermined threshold for a predetermined fan speed.

15. The system of claim 11 in which the means for determining the condition of the filter includes a second temperature sensor disposed to measure the temperature of a gas flow entering the enclosure and a processor, responsive to the second temperature sensor, programmed to compare the temperature of the gas flow entering the enclosure with the temperature inside the disclosure and to provide an output signal indicative of a clogged filter when the difference between the two temperatures exceeds a predetermined amount at a predetermined fan speed.

* * * * *